United States Patent [19]

Miyane

[11] Patent Number: 5,553,260
[45] Date of Patent: Sep. 3, 1996

[54] APPARATUS FOR EXPANDING COMPRESSED BINARY DATA

[75] Inventor: Toshiki Miyane, Suwa, Japan

[73] Assignee: Seiko Epson Corporation, Tokyo-to, Japan

[21] Appl. No.: 70,121

[22] Filed: Jun. 1, 1993

[30] Foreign Application Priority Data

Jun. 1, 1992 [JP] Japan ................................. 4-140333

[51] Int. Cl.$^6$ .................................................. G06F 12/00
[52] U.S. Cl. .................................. 395/421.1; 364/715.02
[58] Field of Search ........................ 395/400, 425, 395/421.1; 341/50, 60, 63; 364/715.02, 715.09, 715.10

[56] References Cited

U.S. PATENT DOCUMENTS

5,237,460 8/1993 Miller et al. .............................. 341/51

*Primary Examiner*—Jack A. Lane
*Attorney, Agent, or Firm*—Harold T. Tsiang

[57] ABSTRACT

A data expansion apparatus that performs data expansion operation for a data block unit in a constant period of time is provided. First and second memory devices are first initialized by storing zeroes at all of their addresses. Numeric data and number-of-zeroes data (i.e., data representing the number of successive zeroes) are input to the data expansion apparatus. A calculation circuit outputs a calculated value by combining the number-of-zeroes data, a previous calculated value and 1 together. A first selection circuit associated with the first memory device selects the calculated value and numeric data and output them to the first memory device for storing the numeric data at the address specified by the calculated value. This operation is then repeated. After the first memory device completes the expansion operation, it is switched to perform read operation and the second memory device begins to perform expansion operation through second selection circuit in a similar manner. In performing the read operation by the first memory device, the first selection circuit selects the output of a read address generator and zeroes from a zerodata device and outputs them to the first memory device for reading out the data at the address specified by the output of the read address generator. At the same time, zeroes from the zero data device are input to the first memory device to replace those data which have been read out. This operation is then repeated. After the first memory device completes the read operation, it is switched back to perform expansion operation and the second memory device begins to perform read operation through the second selection circuit in a similar manner. Therefore, the data expansion operation is performed by alternately switching the operations performed by the first and second memory devices.

19 Claims, 5 Drawing Sheets

FIG._1

| Calculation Sequence | 1 | 2 | 3 | 4 | 5 | 6 | 7 | ......... |
|---|---|---|---|---|---|---|---|---|
| Previous Calculated Data | −1 | 0 | 8 | 10 | 26 | 37 | 53 | ......... |
| Number-of-zeroes Data | 0 | 7 | 1 | 15 | 10 | 15 | 9 | ......... |
| Calculated Value | 0 | 8 | 10 | 26 | 37 | 53 | 63 | ......... |

*FIG._2*

| Input Sequence | 1 | 2 | 3 | 4 | 5 | 6 | 7 | ......... |
|---|---|---|---|---|---|---|---|---|
| Number-of-zeroes Data | 0 | 7 | 1 | 15 | 10 | 15 | 9 | ......... |
| Numeric Data | 1 | 3 | 5 | 0 | 6 | 0 | 1 | ......... |

*FIG._4*

| Output Cycle | 1 | 2 | 3 | 4 | 5 | 6 | 7 | 8 | ... |
|---|---|---|---|---|---|---|---|---|---|
| Data Output | 1 | 0 | 3 | 0 | 0 | 0 | 0 | 5 | ... |

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |

FIG._5

| 1 | 0 | 0 | 0 | 0 | 0 | 0 | 0 |
|---|---|---|---|---|---|---|---|
| 3 | 0 | 5 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 6 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 1 |

APPARATUS FOR EXPANDING COMPRESSED BINARY DATA

BACKGROUND OF THE INVENTION

The present invention relates to a data expansion apparatus for expanding data comprising numeric data and number-of-zeroes data, i.e., data representing the number of successive zeroes.

Figure 3:
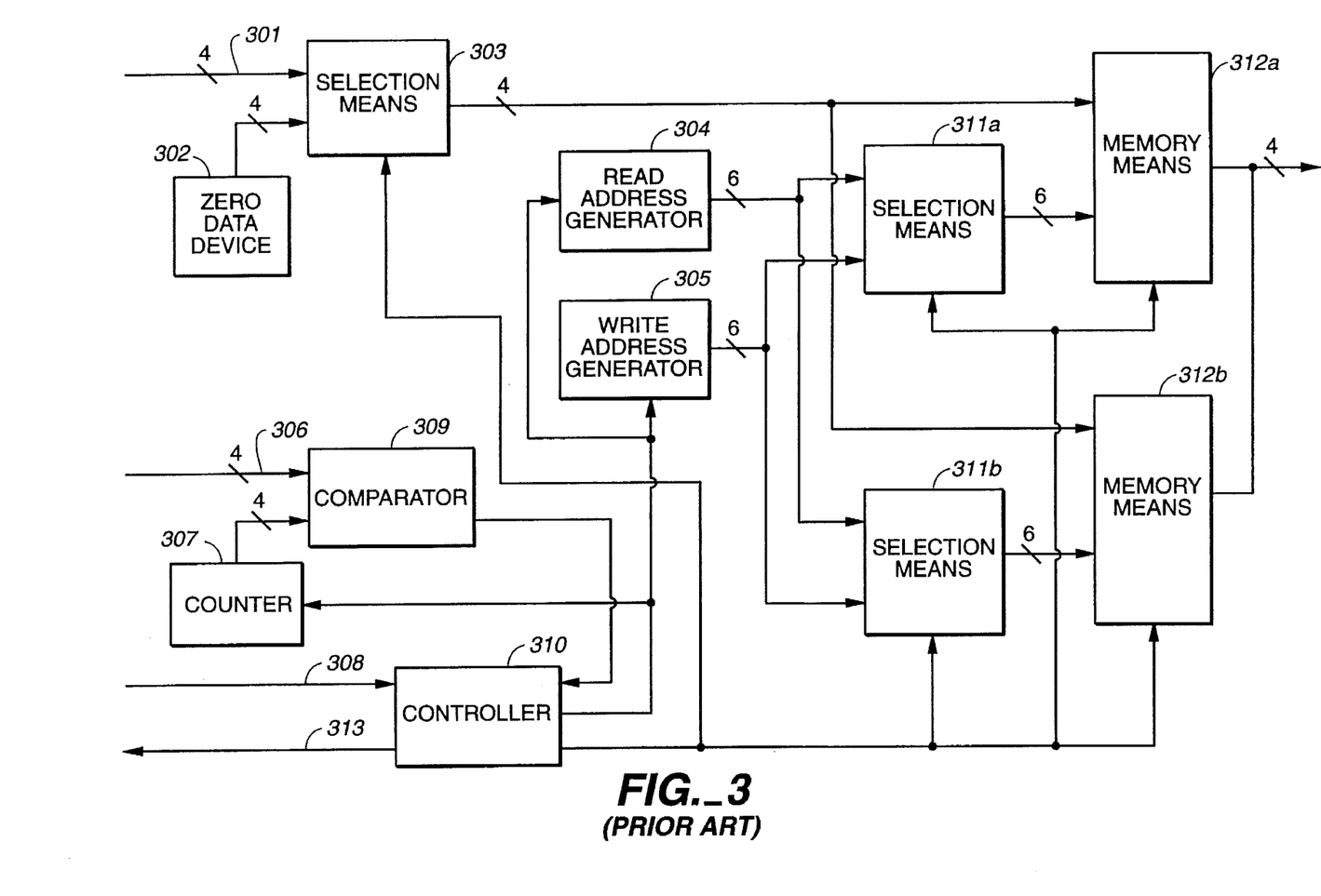
FIG. 3 is a block diagram of a prior art data expansion apparatus.

FIG. 3 shows a prior art data expansion apparatus. Selection means 303 selects either numeric data 301 from an external device or zeroes from zero data device 302. Selection means 311a and 311b each select the output from either read address generator 304 or write address generator 305 and output it to memory means 312a and 312b, respectively. In write operation, i.e., an expansion operation, memory means 312a and 312b store the output of selection means 303 at the addresses specified by the output of write address generator 305 through selection means 311a and 311b, respectively. In read operation, memory means 312a and 312b output the data from the addresses specified by the output of read address generator 304 through selection means 311a and 311b, respectively.

A comparator 309 compares number-of-zeroes data 306 from the external device with the output of counter 307. The output of comparator 309 and a data validation flag 308 are input to controller 3 10, which outputs a control signal to selection means 303, 311a and 311b, read address generator 304, write address generator 305, counter 307, and memory means 312a and 312b. Controller 310 also provides an expansion completion flag 313 to the external device.

The operation of this prior art apparatus is now described. It is assumed that the numeric data and number-of-zeroes data are four bits, and each data block is 8×8 bits. The storage capacity of memory means 312a and 312b is one data block each, and the initialization value of counter 307 is zero. The input data for the operation are shown in FIG. 4 and the addresses of each of memory means 312a and 312b are shown in FIG. 5.

In FIG. 3, data validation flag 308 is input to controller 310. Controller 310 then outputs control signals to all circuit blocks to start the data expansion operation. The values of the first set of number-of-zeroes data 306 and numeric data 301 are 0 and 1, respectively. Since the value of the number-of-zeroes data and the initialization value of counter are both zero, comparator 309 immediately outputs a match flag to controller 310.

Selection means 303 selects numeric data 301 of a value 1 and outputs it to memory means 312a in response to the control signal from controller 310. Furthermore, selection means 311a selects address 0 output by write address generator 305 and outputs it to memory means 312a. Thus, numeric data 301 of a value 1 is stored at address 0 of memory means 312a. Controller 310 then outputs an expansion completion flag 313 to the external device and a control signal to counter 307 for initialization. Then, another data validation flag 308 is input to controller 310, and next set of input data are input to the apparatus.

Figure 4:
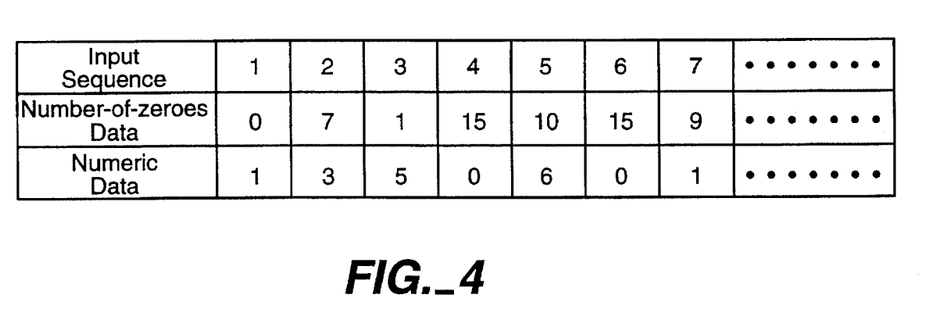
FIG. 4 shows the input data in the examples describing the prior art and the invention.
Figure 5:
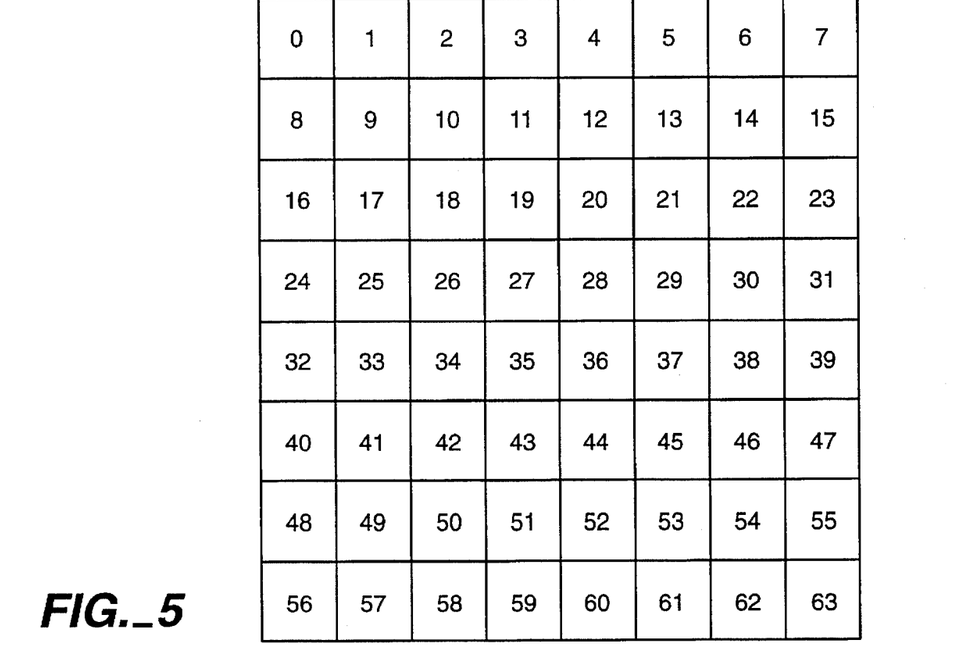
FIG. 5 shows the addresses of the memory means in the examples describing the prior art and the invention.

The values of the next set of number-of-zeroes data 306 and numeric data 301 are 7 and 3, respectively, as shown in FIG. 4. Selection means 303 continuously selects and outputs zeroes from zero data device 302 until the value of counter 307 is counted up to 7, matching the value of numeric data 301. Write address generator 305 generates addresses and outputs them to memory means 312a through selection means 311a, counting up in synchronism with counter 307 from address 1. Thus, 0 is stored at addresses 1–7 in memory means 312a. When the output of counter 307 matches the value of number-of-zeroes data 306, comparator 309 sends out a match flag to controller 310.

Selection means 303 selects numeric data 301 of a value 3 and outputs it to memory means 312a in response to the control signal. Furthermore, selection means 311a selects address 8 output by write address generator 305 and outputs it to memory means 312a. Thus, numeric data 301 of a value 3 is stored at address 8 of memory means 312a. Controller 310 then outputs expansion completion flag 313 to the external device and a control signal to counter 307 for initialization. Then, another data validation flag 308 is input to controller 310. Thereafter, the same operation is repeated until the capacity of memory means 312a is full, i.e., until data is written to address 63.

Figure 6:
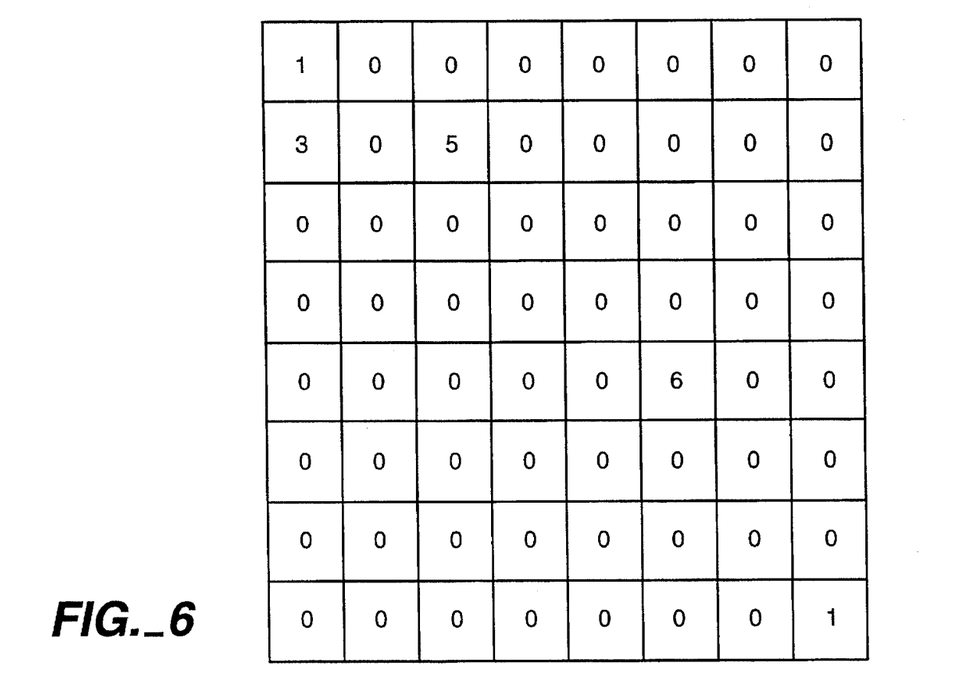
FIG. 6 shows the contents of the memory means after the expansion operation is completed in the examples describing the prior art and the invention.

FIG. 6 shows the contents of memory means 312a after the above expansion operation is completed. After memory means 312a completes the expansion operation, it is switched to perform read operation. Controller 310 sends a control signal to initialize write address generator 305 to 0.

Figure 7:
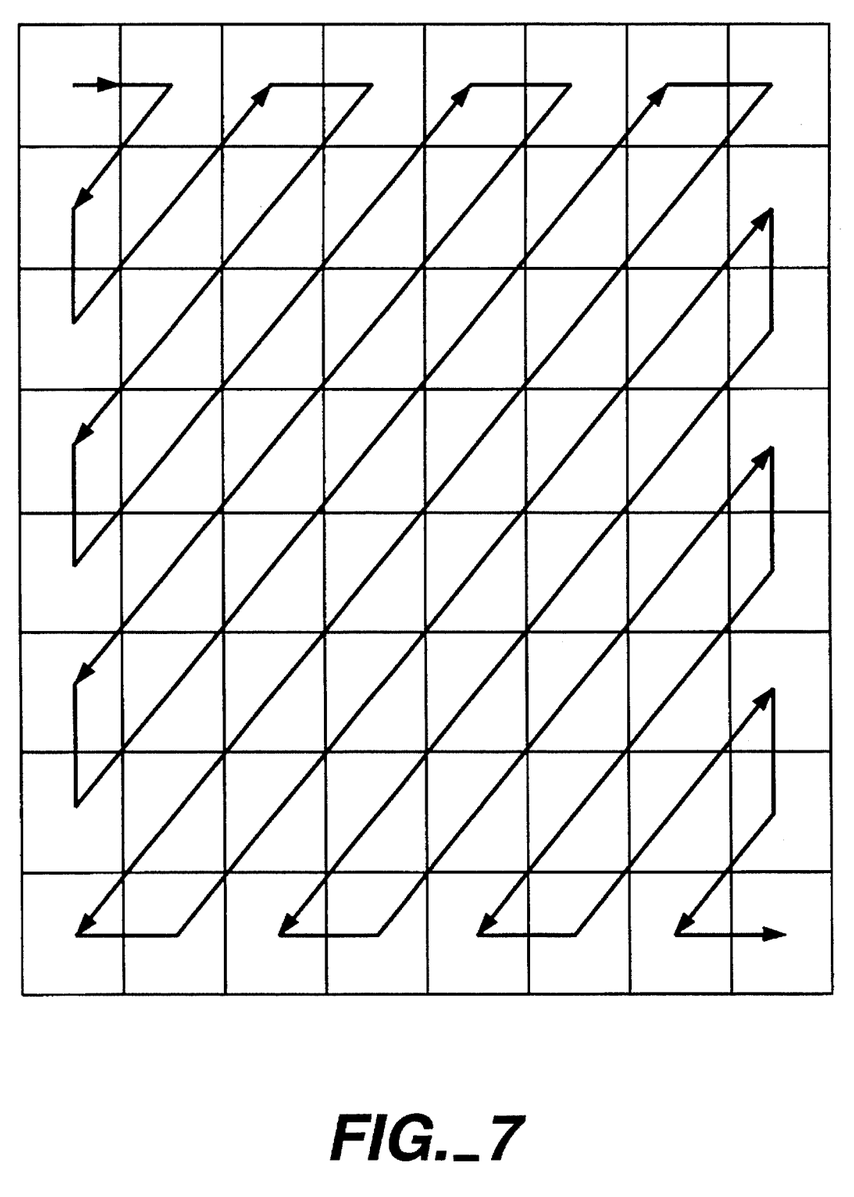
FIG. 7 shows the zigzag scan sequence in which the data is read out from the memory means in the examples describing the prior art and the invention.

FIG. 7 shows the zigzag scan sequence in which the data is read out from memory means 312a. Read address generator 304 generates addresses in this zigzag scan sequence and outputs them to memory means 312a through selection means 311a.

Figure 8:
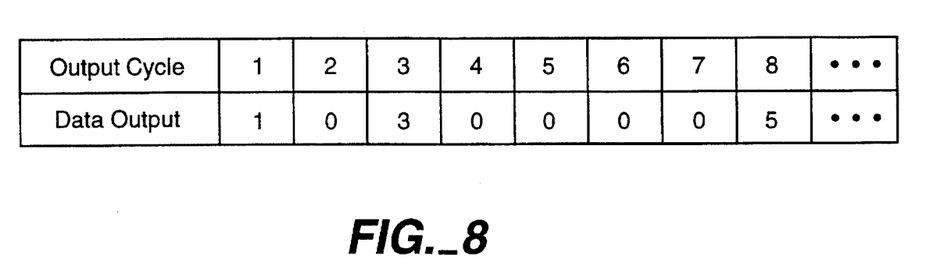
FIG. 8 shows the data read out from the memory means in the examples describing the prior art and the invention.

FIG. 8 shows the data read out from memory means 312a in that zigzag manner. In the above apparatus, when memory means 312a is performing read operation, memory means 312b is performing expansion operation. After memory means 312a completes read operation, it is switched to perform expansion operation and memory means 312b is switched to perform read operation. Thus, the expansion operation is performed by alternately switching the operations performed by memory means 312a and 312b.

In the data expansion apparatus described above, the expansion operation for a given data block depends upon the number of continuous zeroes in the data block. The more number of continuous zeroes the data block has, the longer it takes to perform the expansion operation. Moreover, since it is difficult to control the timing of the data transfer to the data expansion apparatus, a buffer or other means is required for storing the data before they are transferred to the expansion apparatus to match the speed of data input and that of expansion operation. Consequently, it results in a larger and more complex device.

SUMMARY OF THE INVENTION

The invention provides a data expansion apparatus which eliminates the operation of expanding zeroes and performs data expansion by storing only the numeric data. Thus, the expansion operation for a data block unit is performed in a constant period of time.

According to one aspect of the invention, first and second memory means are first initialized by storing zeroes at all of their addresses. Numeric data and number-of-zeroes data (i.e., data representing the number of successive zeroes) are input to the data expansion apparatus.

According to another aspect of the invention, calculation means outputs a calculated value by combining the number-or-zeroes data, a previous calculated value and a predetermined value together. In a preferred embodiment, the predetermined value is 1.

According to a further aspect of the invention, first selection means associated with the first memory means selects the calculated value and numeric data and output them to the first memory means so that the numeric data is stored at the address specified by the calculated value. This operation is then repeated. After the first memory means completes the expansion operation, it is switched to perform read operation and the second memory means begins to perform expansion operation through second selection means in a similar manner.

According to a still further aspect of the invention, in performing the read operation by the first memory means, the first selection means selects the output of a read address generator and zeroes and outputs them to the first memory means so that the data is read out from the address specified by the output of the read address generator. At the same time, zeroes are input to the first memory means to replace those data which have been read out. This operation is then repeated. After the first memory means completes the read operation, it is switched back to perform expansion operation and the second memory means begins to perform read operation through the second selection means in a similar manner. Therefore, the data expansion operation is performed by alternately switching the operations performed by the first and second memory means.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
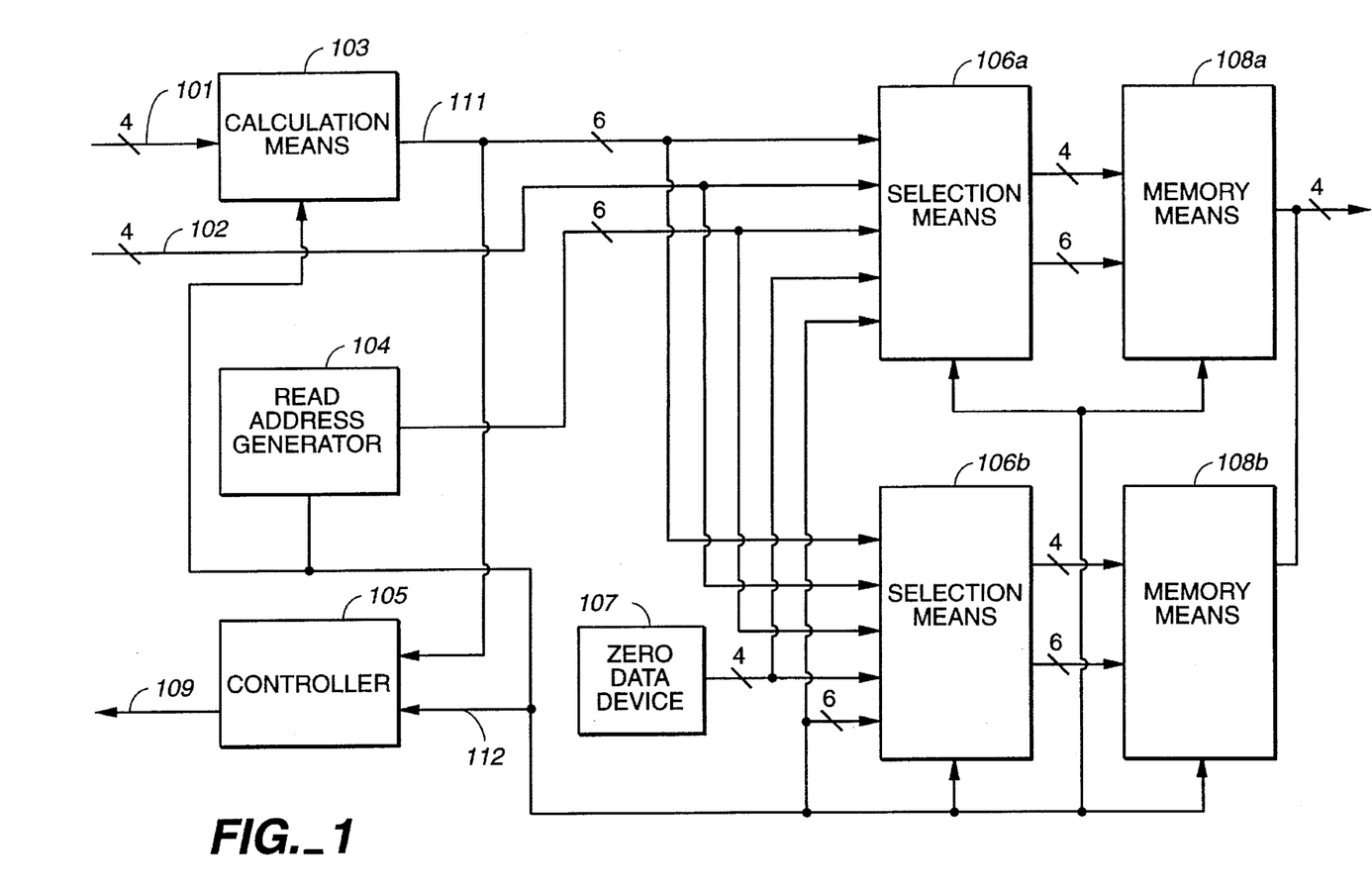
FIG. 1 is a block diagram of a data expansion apparatus according to the invention.

FIG. 1 is a block diagram of a data expansion apparatus according to the invention. In FIG. 1, calculation means 103, a read address generator 104, a controller 105 and a zero data device 107 each are connected to selection means 106a and 106b, which are in turn connected to memory means 108a and 108b, respectively.

Calculation means 103 outputs a calculated value 111 to controller 105 and selection means 106a and 106b. This calculated value 111 is obtained by combining number-of-zeroes data 101 from an external source, a previous calculated value, and 1 together, as will be further described below. Read address generator 104 generates addresses in a predetermined sequence and outputs them to selection means 106a and 106b. Controller 105 provides a control signal 112 and a data stop signal 109. Control signal 112 is provided to calculation means 103, read address generator 104, selection means 106a and 106b, and memory means 108a and 108b. Data stop signal 109 is provided to the external source. Zero data device 107 supplies zeroes to selection means 106a and 106b.

Before the data expansion operation begins, zeroes from zero data device 107 are input to memory means 108a and 108b through selection means 106a and 106b, respectively, to initialize the memory means so that 0 is stored at each of their addresses. Then, number-of-zeroes data 101 and numeric data 102 from an external source are input to the data expansion apparatus. Selection means 106a selects the output of calculation means 103, i.e., calculated value 111, and numeric data 102 and output them to memory means 108a. Memory means 108a then stores numeric data 102 at the addresses specified by the output of calculation means 103. This operation is repeated until all of the numeric data in a data block have been stored in memory means 108a. After memory means 108a completes the expansion operation, it is switched to perform read operation. At this time, memory 108b begins to perform expansion operation through selection means 106b in the same manner as described above for memory means 108a.

In performing read operation by memory means 108a, selection means 106a selects the output of read address generator 104 and zeroes from zero data device 107 and output them to memory means 108a. Memory means 108a outputs the data from the addresses specified by the output of read address generator 104. At the same time, zeroes from zero data device 107 are input to memory means 108a to replace those data which have been read out to initialize the memory means. This operation is repeated until all of the data in memory means 108a have been read out. After memory means 108a completes the read operation, it is switched back to perform expansion operation. At this time, memory means 108b is switched to perform read operation in the same manner as described above for memory means 108a. In this way, memory means 108a and 108b alternately perform expansion and read operation until all the data in the data block has been processed.

The operation of the data expansion apparatus can be best understood by way of an example using the input data shown in FIG. 4. In this example, it is assumed that number-of-zeroes data 101 and numeric data 102 are four bits each, and each data block is 8×8 bits. Furthermore, the storage capacity of memory means 108a and 108b is one data block each, and the initialization value for calculation means 103 is −1.

Before the expansion operation starts, selection means 106a and 106b receive the output of controller 105 and zeroes from zero data device 107 and outputs the zeros to memory means 108a and 108b. Controller 105 outputs a signal to selection means 106a and 106 b for generating addresses of memory means 108a and 108b, by the two selection means by counting up the address from 0 to 63. Thus, memory means 108a and 108b are initialized by storing 0 at their addresses 0 –63. After initialization is completed, the expansion operation begins.

The data is input according to the sequence shown in FIG. 4. Number-of-zeroes data 101 and numeric data 102 of values 0 and 1, respectively, from an external source are input to the data expansion apparatus. Calculation means 103 combines number-of-zeroes data 101, the previous calculated value, −1, (which is the initialization value at the beginning of the expansion operation), and 1 together and outputs the sum of these data, 0, as calculated value 111. This sum will be the previous calculated value for the next calculation. Selection means 106a selects calculated value 111 and numeric data 102 and outputs them to memory means 108a. This selected numeric data, 1, is stored in memory means 108a at the address specified by calculated value 111, i.e., address 0. After the numeric data is stored, the next set of data comprising number-of-zeroes data 101 and numeric data 102 of values 7 and 3, respectively, from the external source is input to the data expansion apparatus. Calculation means 103 again combines number-of-zeroes data 101, the previous calculated value, 0, and 1 together and outputs the sum of these data, 8, as calculated value 111. Again, this sum will be used as the previous calculated value for the following calculation. Selection means 106a then selects calculated value 111 and numeric data 102 and outputs them to memory means 108a. This selected numeric data, 3, is stored in memory means 108a at address 8 specified by calculated value 111. This operation is repeated until the data expansion by memory means 108a is completed.

Figure 2:
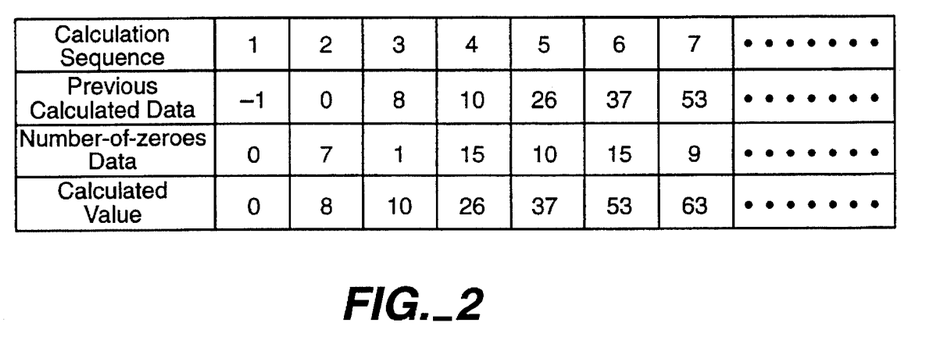
FIG. 2 shows the results of the calculations in the example describing the invention.

FIG. 2 shows the results of the calculations in the above example. The contents of memory means 108a after the data expansion are shown in FIG. 6. After memory means 108a completes the data expansion operation, calculated value 111 is reinitialized to −1 by the control signal from controller 105. Memory means 108a is then switched to perform data read operation by outputting the stored data. At this time, selection means 106a selects the output of read address generator 104 and zeroes from zero data device 107 and outputs them to memory means 108a. Read address generator 104 outputs addresses to memory means 108a through selection means 106a in the zigzag scan sequence shown in FIG. 7. Memory means 108a then outputs data stored at the addresses specified by the output of read address generator 104. During the read operation, memory means 108a effectively operates at twice the cycle rate. In other words, after data is read from an address in memory means 108a, 0 is stored at that address by the time-sharing processing to initialize the memory means. Thus, when the read operation is completed, 0 is stored at all addresses in memory means 108a.

The read operation performed by memory means 108a is parallel to the data expansion operation performed by memory means 108b. If memory means 108b completes the expansion operation before memory means 108a completes the read operation, data stop signal 109 is output to the external device and the expansion operation is stopped. After memory means 108a completes the read operation, it is switched back to perform expansion operation. Furthermore, memory means 108b is switched to perform data read operation and data stop signal 109 is canceled.

Thus, data expansion operation can be performed by alternately switching the operations performed by memory means 108a and 108b. Moreover, the data expansion operation for a given data block can be performed in a constant period of time. Therefore, a buffer is not required in the data expansion apparatus and the size of the circuit is reduced and simplified.

In the above embodiment, the data block unit is 8×8 bits. However, a data block unit of any other size can be used. Also, while a predetermined sequence (the zigzag scan sequence above) is used for the read operation above, a predetermined sequence can also be followed in the data write operation. Furthermore, the same results as above can be obtained when zeroes are externally supplied.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A data expansion apparatus for expanding a data block that includes a plurality of pairs of number-of-zeroes data and numeric data supplied by an external apparatus, the number-of-zeroes data representing the number of a series of successive zeroes, the data expansion apparatus comprising:

control means for providing control signals;

calculation means, responsive to said control means, for receiving number-of-zeroes data supplied from the external apparatus and for calculating an address value by combining the number-of-zeroes data, a previously calculated address value of said calculation means and a predetermined constant, said previously calculated address value being an address value calculated immediately before a current calculation by said calculation means, said previously calculated address value being preset to an initialization value by said calculation means at the initialization of the data expansion apparatus;

zero data device means for supplying zeroes;

selection means, responsive to said control means, for receiving numeric data from the external apparatus, address values from said calculation means and zeroes from said zero data device means for selectively outputting the numeric data, address values and zeroes; and memory means, responsive to said control means, for receiving the outputs of said selection means such that at the initialization of the data expansion apparatus said memory means receives zeroes from said selection means and stores a zero at each of its addresses, and in expansion operation said memory means receives the numeric data and the associated address values from said selection means and stores each numeric data at its associated address.

2. The apparatus of claim 1 wherein the predetermined constant is 1.

3. The apparatus of claim 1 wherein the previously calculated address value is preset to the initialization value by said calculation means after each expansion operation by said memory means.

4. The apparatus of claim 3 wherein the initialization value is −1.

5. A data expansion apparatus for expounding a data block that includes a plurality of pairs of number-of-zeroes data and numeric data supplied by an external apparatus, the number-of-zero data representing the number of a series of successive zeroes, the data expansion apparatus comprising:

control means for providing control signals;

calculation means, responsive to said control means, for receiving number-of-zeroes data supplied from the external apparatus and for calculating an address value by combining the number-of-zeroes data, a previously calculated address value of said calculation means and a predetermined constant, said previously calculated address value being an address value calculated immediately before a current calculation by said calculation means, said previously calculated address value being preset to an initialization value by said calculation means at the initialization of the data expansion apparatus;

zero data device means for supplying zeroes;

selection means, responsive to said control means, for receiving numeric data from the external apparatus, address values from said calculation means and zeroes from said zero data device means for selectively outputting the numeric data, address values and zeroes; and memory means, responsive to said control means, for receiving the outputs of said selection means such that at the initialization of the data expansion apparatus said memory means receives zeroes from said selection means and stores a zero at each of its addresses, and in expansion operation said memory means receives the numeric data and the associated address values from said selection means and stores each numeric data at its associated address;

a read address generator, coupled to said selection means and controlled by said control means, for generating read addresses;

wherein in read operation said memory means receives read addresses and zeroes from said selection means, outputs data at associated read addresses and stores a zero at each address where the data has been output.

6. The apparatus of claim 5 wherein said read address generator generates read addresses in a predetermined sequence.

7. The apparatus of claim 6 wherein the predetermined sequence is zigzag scan sequence.

8. A data expansion apparatus for expanding a data block that includes a plurality of pairs of number-of-zeroes data and numeric data supplied by an external apparatus, the number-of-zeroes data representing the number of a series of successive zeroes, the data expansion apparatus comprising:

control means for providing control signals;

calculation means, responsive to said control means, for receiving number-of-zeroes data supplied from the external apparatus and for calculating an address value by combining the number-of-zeroes data, a previously calculated address value of said calculation means and a predetermined constant, said previously calculated address value being an address value calculated immediately before a current calculation by said calculation means, said previously calculated address value being preset to an initialization value by said calculation means at the initialization of the data expansion apparatus;

zero data device means for supplying zeroes;

read address generator, responsive to said control means, for generating read addresses;

first selection means, responsive to said control means, for receiving numeric data from the external apparatus, address values from said calculation means, read addresses from said read address generator and zeroes from said zero data device means for selectively outputting the numeric data, address values, read addresses and zeroes;

first memory means, responsive to said control means, for receiving the outputs of said first selection means such that at the initialization of the data expansion apparatus said first memory means receives zeroes from said first selection means and stores a zero at each of its addresses, in expansion operation said first memory means receives the numeric data and the associated address values from said first selection means and stores each numeric data at its associated address, and in read operation said first memory means receives the read addresses and zeroes from said first selection means, outputs data at associated read addresses and stores a zero at each address where the data has been output;

second selection means, responsive to said control means, for receiving the numeric data from the external apparatus, the address values from said calculation means, the read addresses from said read address generator and the zeroes from said zero data device means for selectively outputting the numeric data, address values, read addresses and zeroes; and second memory means, responsive to said control means, for receiving the outputs of said second selection means such that at the initialization of the data expansion apparatus said second memory means receives zeroes from said second selection means and stores a zero at each of its addresses, in expansion operation said second memory means receives the numeric data and the associated address values from said second selection means and stores each numeric data at its associated address, and in read operation said second memory means receives the read addresses and zeroes from said second selection means, outputs data at associated read addresses and stores a zero at each address where the data has been output;

wherein said first and second memory means alternately perform expansion and read operations such that as said first memory means performs expansion operation, said second memory means performs read operation, and when said first memory means completes the expansion operation, it performs read operation and said second memory means performs expansion operation, until all the pairs of the number-of-zeroes data and numeric data of the data block have been processed.

9. The apparatus of claim 8 wherein the predetermined constant is 1.

10. The apparatus of claim 8 wherein the previously calculated address value is preset to the initialization value after each expansion operation by any one of said two memory means.

11. The apparatus of claim 10 wherein the initialization value is −1.

12. The apparatus of claim 8 wherein if an expansion operation by one of said two memory means is completed before a read operation by the other memory means is completed, said control means outputs a data stop signal to the external apparatus to stop the expansion operation.

13. The apparatus of claim 8 wherein said read address generator generates read addresses in a predetermined sequence.

14. The apparatus of claim 13 wherein the predetermined sequence is zigzag scan sequence.

15. A data expansion apparatus for expanding a data block that includes a plurality of pairs of number-of-zeroes data and numeric data supplied by an external apparatus, the number-of-zeroes data representing the number of a series of successive zeroes, the data expansion apparatus comprising:

control means for providing control signals;

calculation means, responsive to said control means, for receiving number-of-zeroes data supplied from the external apparatus and for calculating an address value by adding together the number-of-zeroes data, a previously calculated address value of said calculation means and a constant value of 1, said previously calculated address value being an address value calculated immediately before a current calculation by said calculation means, said previously calculated address value being preset to an initialization value of −1 by said calculation means at the initialization of the data expansion apparatus, wherein after the initialization of the data expansion apparatus, said calculation means calculates each address value by adding together a currently received number-of-zeroes data, a previously calculated address value calculated by said calculated means and a constant value of 1;

zero data device means for supplying zeroes;

read address generator, responsive to said control means, for generating read addresses;

first selection means, responsive to said control means, for receiving numeric data from the external apparatus, address values from said calculation means, read addresses from said read address generator and zeroes from said zero data device means for selectively outputting the numeric data, address values, read addresses and zeroes;

first memory means, responsive to said control means, for receiving the outputs of said first selection means such that at the initialization of the data expansion apparatus said first memory means receives zeroes from said first selection means and stores a zero at each of its addresses, in expansion operation said first memory means receives the numeric data and the associated address values from said first selection means and stores each numeric data at its associated address, and in read operation said first memory means receives the read addresses and zeroes from said first selection means, outputs data at associated read addresses and stores a zero at each address where the data has been output;

second selection means, responsive to said control means, for receiving the numeric data from the external apparatus, the address values from said calculation means, the read addresses from said read address generator and the zeroes from said zero data device means for selectively outputting the numeric data, address values, read addresses and zeroes; and second memory means, responsive to said control means, for receiving the outputs of said second selection means such that at the initialization of the data expansion apparatus said second memory means receives zeroes from said second selection means and stores a zero at each of its addresses, in expansion operation said second memory means receives the numeric data and the associated address values from said second selection means and stores each numeric data at its associated address, and in read operation said second memory means receives the read addresses and zeroes from said second selection means, outputs data at associated read addresses and stores a zero at each address where the data has been output;

wherein said first and second memory means alternately perform expansion and read operations such that as said first memory means performs expansion operation, said second memory means performs read operation, and when said first memory means completes the expansion operation, it performs read operation and said second memory means performs expansion operation, until all the pairs of the number-of-zeroes data and numeric data of the data block have been processed.

16. The apparatus of claim 15 wherein if an expansion operation by one of said two memory means is completed before a read operation by the other memory means is completed, said control means outputs a data stop signal to the external apparatus to stop the expansion operation.

17. The apparatus of claim 15 wherein said read address generator generates read addresses in a predetermined sequence.

18. The apparatus of claim 17 wherein the predetermined sequence is zigzag scan sequence.

19. A method for expanding a data block that includes a plurality of pairs of number-of-zeroes data and numeric data, the number-of-zeroes data representing the number of a series of successive zeroes, the method comprising:

storing zeroes at each address of a memory device at initialization;

calculating an address value by adding together the number-of-zeroes data, a previously calculated address value and a constant value of 1, said previously calculated address value being an address value calculated immediately before a current calculation, said previously calculated address value being −1 at initialization; and storing numeric data at the associated calculated address in the memory device in expansion operations;

wherein the steps of calculating the address value and storing numeric data are repeated until all the number-of-zeroes data have been processed in the calculating step and stored in the memory device.

* * * * *

UNITED STATES PATENT AND TRADEMARK OFFICE
CERTIFICATE OF CORRECTION

PATENT NO. : 5,553,260
DATED : September 3, 1996
INVENTOR(S) : Toshiki Miyane

It is certified that error appears in the above-indentified patent and that said Letters Patent is hereby corrected as shown below:

Column 6, Line 42, change "claim 1" to --claim 5--.

Column 6, Line 44, change "claim 1" to --claim 5--.

Column 6, Line 50, change "expounding" to --expanding--.

Signed and Sealed this

Fourth Day of February, 1997

Attest:

BRUCE LEHMAN

*Attesting Officer*          *Commissioner of Patents and Trademarks*